United States Patent

Grewal et al.

Patent Number: 6,071,820
Date of Patent: *Jun. 6, 2000

[54] METHOD FOR PATTERNING INTEGRATED CIRCUIT CONDUCTORS

[75] Inventors: Virinder Grewal; Bruno Spuler, both of Wappingers Falls, N.Y.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/940,892

[22] Filed: Sep. 30, 1997

[51] Int. Cl.$^7$ ............................................. H01L 21/00
[52] U.S. Cl. ..................... 438/706; 438/710; 438/720; 438/742
[58] Field of Search ................... 438/720, 742, 438/710, 706

[56] References Cited

U.S. PATENT DOCUMENTS

| | | | |
|---|---|---|---|
| 4,373,990 | 2/1983 | Porter | 438/720 |
| 4,678,540 | 7/1987 | Uchimura | 438/720 |
| 5,387,556 | 2/1995 | Xiaobing et al. | 438/720 |

*Primary Examiner*—Felisa Hiteshew
*Assistant Examiner*—Lynette T. Umez-Eronini
*Attorney, Agent, or Firm*—Stanton C. Braden

[57] ABSTRACT

A method for forming integrated circuit conductors. The method includes the steps of placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers. Radio frequency energy is inductively coupled into the chamber while silicon tetrachloride and chlorine are introduced into the chamber at rates selected to etch portions of the metalization layer exposed by the photoresist with aluminum having substantially vertical sidewalls. The silicon tetrachloride is introduced into the chamber at a rate in the range of 4 to 8 sccm. The rate of the chlorine is in the range of 50 sccm to 150 sccm. The chamber is at a pressure of about 12 milliTorr during the etching of the metalization layer. The chamber operates with an RF power of about 125 watts while the semiconductor is disposed on a platform in the chamber having an RF bias power level of about 250 watts during the etching.

17 Claims, 7 Drawing Sheets

METHOD FOR PATTERNING INTEGRATED CIRCUIT CONDUCTORS

BACKGROUND OF THE INVENTION

This invention relates generally to semiconductors and more particularly to methods for patterning electrical conductors used in such semiconductors.

As is known, the patterning of a metalization layer into electrical conductors typically involves etching portions of the metalization layer exposed by a patterned photoresist layer disposed on the surface of the metalization layer. One etching process uses reactive ion etching. One technique is described in U.S. Pat. No. 5,024,722, entitled Process for fabricating Conductors for Integrated Circuit Connection and the Like" issued Jun. 18, 1991. The patent describes at Column 2, beginning at line 2, that in effort to reduce undesirable lateral etching and undercutting of conductor sidewalls during plasma etching to form aluminum conductors, silicon tetrachloride, $SiCl_4$, has ben added to the plasma reactants to thereby produce and deposit a silicon containing dielectric material on the side walls of the aluminum conductors being formed during the anisotropic plasma etching process. As described in the patent, this aluminum sidewall protective layer in turn produces a retardation of the undesirable horizontal or lateral etching and thereby reduces undercutting of the aluminum islands or conductors thus formed. The patent then states at column 2, beginning at line 57: "However, the use of this latter process employing silicon tetrachloride to form a sidewall organic layer for aluminum has not proven entirely satisfactory inasmuch as the deposition rate of the dielectric material formed on the aluminum sidewalls is too slow. Furthermore, the thin organic film produced by this $SiCl_4$ process has not been significant in thickness and density to in fact prevent all of the above undesirable horizontal or lateral etching of the aluminum sidewalls during the conductor forming process."

The use of $SiCl_4$ as an aluminum etch has also been reported in the following: an article entitled "Aluminum Sputter Etching Using $SiCl_4$", by E. O. Degenkolb, published in the Journal of the Electrochemical Society, Vol. 129, 1982, p. 1150; U.S. Pat. No. 5,082,524 entitled, Addition of Silicon Tetrabromide to Halogenated Plasmas As a Technique for Minimizing Photoresist Deterioration During the Etching of Metal Layers", issued Jan. 21, 1992; U.S. Pat. No. 5,302,241, entitled "Post Etching Treatment of Semiconductor Devices", issued Apr. 12, 1994; and U.S. Pat. No. 5,236,854 entitled "Compound Semiconductor Device and Method for Fabrication Thereof", issued Aug. 17, 1993.

SUMMARY OF THE INVENTION

In accordance with the invention, a method is provided for forming integrated circuit conductors. The method includes the steps of placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers. Radio frequency energy is inductively coupled into the chamber while silicon tetrachloride is introduced into the chamber at a rate selected to cause etching of portions of the metalization layer exposed by the photoresist with the etched aluminum being substantially free of lateral etching. We have discovered that use of an inductively coupled reactive ion etching chamber together with proper flow rate of silicon tetrachloride results in the etching of aluminum electrical conductors having substantially vertical sidewalls with substantially no undercutting occurring at the interface with the barrier metal layers.

In accordance with another feature of the invention, a method is provided for forming integrated circuit conductors. The method includes the steps of placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers. Radio frequency energy is inductively coupled into the chamber while silicon tetrachloride is introduced into the chamber. The silicon tetrachloride is introduced into the chamber at a rate in the range of greater than 4 standard cubic centimeters (sccm) to less than 15 sccm.

BRIEF DESCRIPTION OF THE DRAWING

Other features of the invention, as well as the invention itself, will become more readily apparent from the following detailed description taken together with the accompanying drawings, in which.

DESCRIPTION OF THE PREFERRED EMBODIMENTS

Figure 1A:
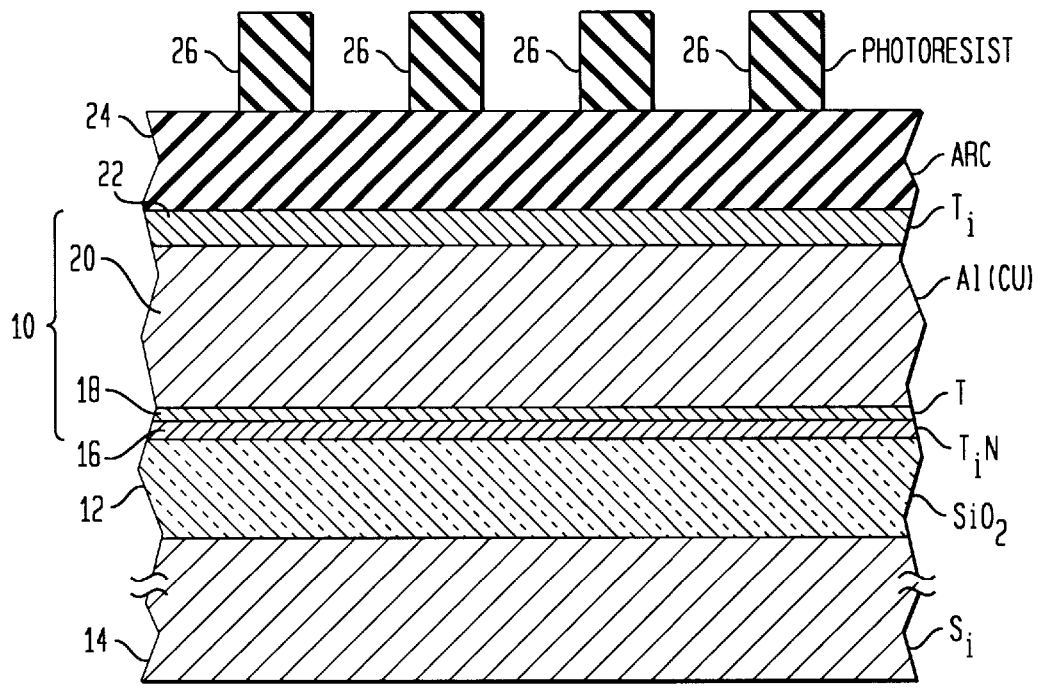
FIGS. 1A–1C are diagrammatical cross-sectional sketches of a semiconductor wafer at various stages in the patterning of a metalization layer thereon in accordance with the invention.

The invention relates to the fabrication of integrated circuits (ICs). The ICs, for example, include random access memories (RAMs) such as dynamic RAMs (DRAMs), synchronous DRAMs (SDRAMs), and a read only memories (ROMs). Other ICs such as application specific ICs (ASICs), merged DRAM-logic circuits (embedded DRAMs), or other logic circuits, are also useful.

Typically, numerous ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

Referring to FIG. 1, a cross-section of a portion of an IC structure formed on a substrate 14 is shown. The substrate is, for example, a silicon wafer. Other substrates such as silicon on insulator (SOI), silicon on sapphire (SOS), germanium, gallium arsenide, and group III–V compounds, are also useful. The major surface of the substrate is not critical and any suitable orientation such as a (100), (110), or (111) is useful.

The IC structure is not shown in detail for purposes of this discussion. The structure may include, for example, various devices that are used to form the IC. The specific details of the structure are not important. As depicted, the IC is shown as part of the substrate 14. The IC structure may also not include any devices at this point in processing. As such, the substrate 14 would be just the surface.

As shown, a metalization layer 10 is disposed on an insulating layer 12 which is disposed on the substrate 14. Here, the insulating layer 12 is silicon dioxide. Other insulating materials are also useful. The metalization layer 10 includes a bottom layer of, for example, titanium nitride 16, here about 200 Å thick, and a layer of titanium 18, here about 100 Å thick. Above the titanium layer, about a 10,000 Å thick layer 20 of aluminum having about a 5% copper content therein and about a 400 Å thick layer 22 of titanium are provided. An anti-reflecting coating 24 (ARC), here having a thickness of about 900 Å is disposed on the upper titanium nitride layer 22, as shown. The ARC is used to improve lithographic resolution. A layer 26 of photoresist, here about 7000 Å thick, is patterned over a selected portion of the metalization and ARC layers 10, 24, respectively, as shown, using conventional photolithography. Here, the separation between adjacent regions of the photoresist layer is, for example, about 0.25 $\mu$m.

Figure 1B:
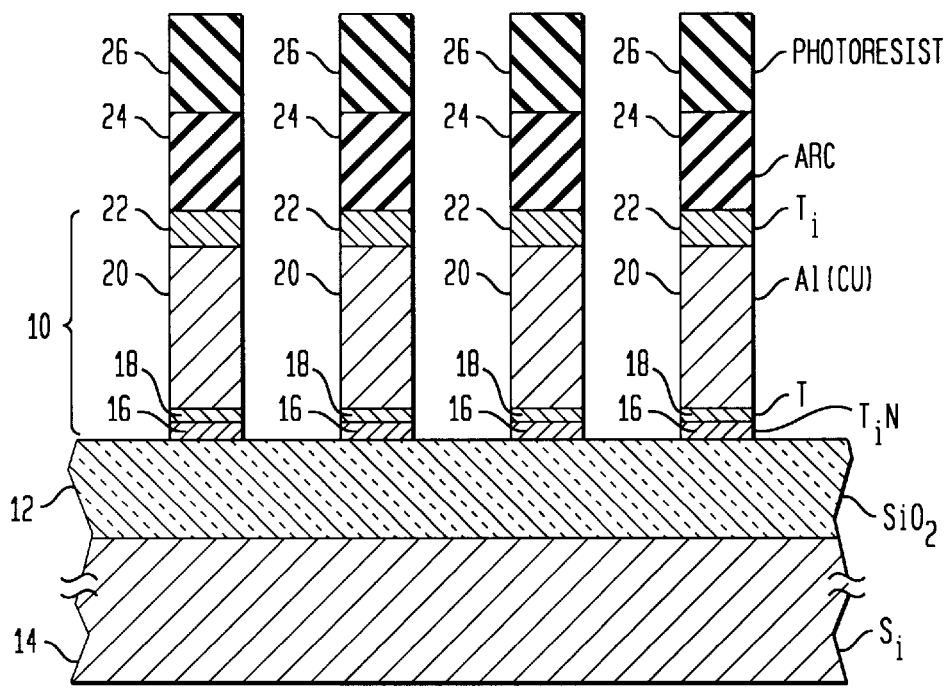
Figure 2:
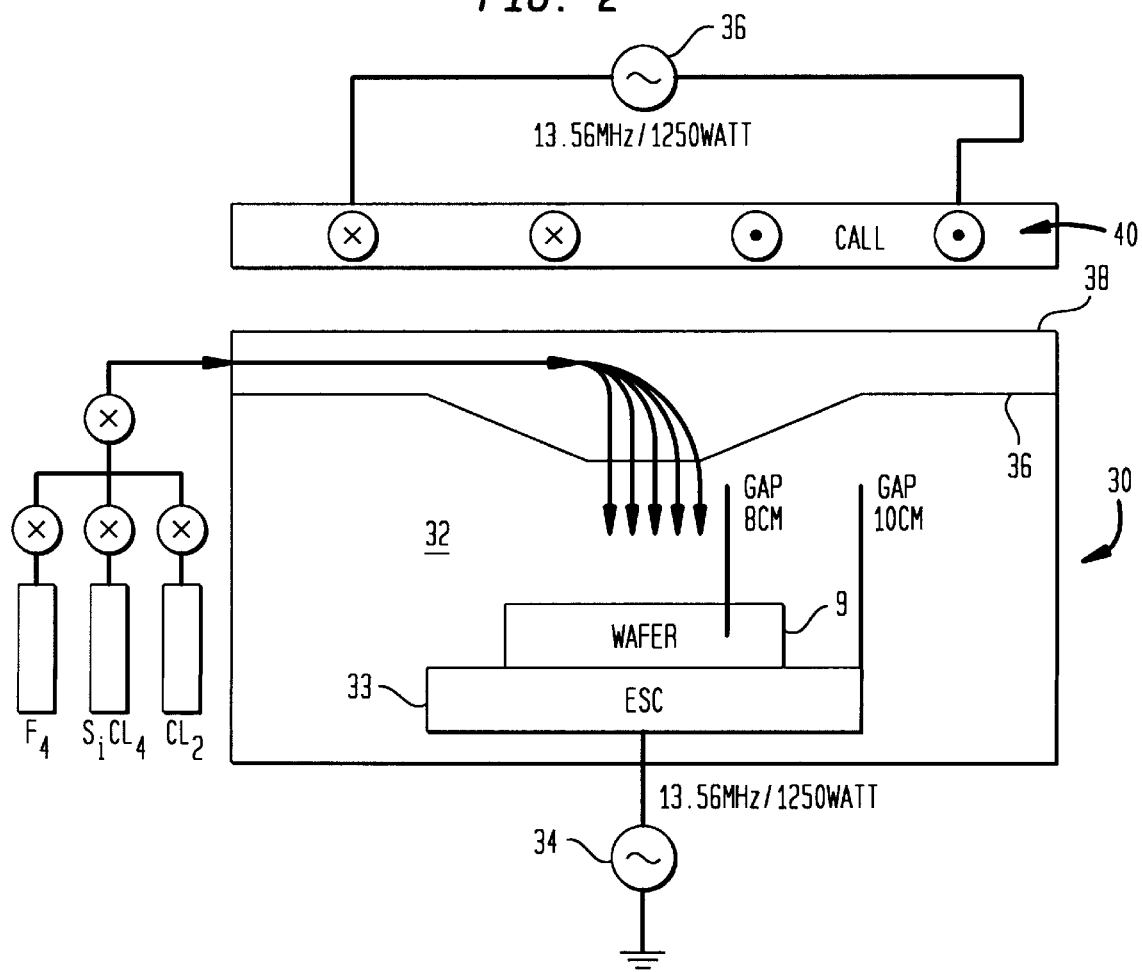
FIG. 2 is a schematic diagram of a reactive ion etching toll having the wafer of FIG. 1A disposed therein, such tool being used to pattern the metalization layer in accordance with the invention.

The structure shown in FIG. 1B is placed in an inductively coupled reactive ion etching (R.I.E.) tool 30, shown in FIG. 2. The R.I.E. tool 30 is here a LAM 9600TCP model TCP 9608SE. There tool 30 has a chamber 32 which has disposed therein a wafer support 33 fed by an RF bias voltage source 34, here about a 13.56 Mhz, and about a 1250 Watt source, and a half-height shaped top electrode 36 with about an 8 cm gap between the central region of the wafer support 33 and about a 10 cm gap between the outer peripheral region of the wafer support 33. The chamber 32 has a dielectric dome 34 and a coil disposed outside the dome 34, as shown. The coil 34 is coupled to an RF supply 36, here the supply is a 13.56 MHZ, 1250 supply. When powered by the supply 36, RF energy is inductively coupled into the chamber 32 through the dielectric dome 34. The chamber 32 is adapted in have introduced therein chlorine gas, $Cl_2$, silicon tetrachloride, $SiCl_4$, and $CF_4$, at rates to be described.

The chamber 32 is operated at the following operating conditions: a chamber temperature of about 70° C., a wafer support 33 temperature of about 40° C.

After the chamber 32 has operated under the above conditions for an initialization time of 15 second, during a subsequent first step, the pressure of the chamber is increased to a range of about 5 milliTorr to about 20 milliTorr, here, in this example, about 12 milliTorr, chlorine is introduced into the chamber at a rate in the range of about 50 sccm to 150 sccm, here, in this example a rate of about 100 sccm, and silicon tetrachloride is introduced into the chamber at a rate in the range of greater than about 4 standard cubic centimeters (sccm) to less than about 15 sccm; here at a rate of about 4 to 8 sccm, and in this example at a rate of about 5 sccm. After 30 second, with the pressure in the 32 chamber maintained at about 12 milliTorr, the gap is 8 cm at the central region, as shown, the RF power to the coil from supply 36 in raised to a range between about 100 watts and 200 watts, about 150 watts in this example and the RF power from supply 34 to the support is raised to the range of about 100 watts to 300 watts, 200 watts in this example, while the chlorine continues into the chamber 32 at the rate of about 100 sccm, and the silicon tetrachloride continues into the chamber 32 at the rate of about 4 to 8 sccm, in this example at a rate of about 5 sccm, and helium backside cooling of wafer support 33 and the Electrostatic Chuck (ESC) used by the support 33 is maintained at the pressure of 8 milliTorr. These conditions continue for about 100 seconds. Next, the RF bias power from supply 34 is reduced to about zero, the flow of silicon tetrachloride is reduced to about zero, and $CF_4$ is introduced into the chamber 32 at a rate of about 50 for 30 seconds to remove polymers which have built-up, (i.e., become deposited) during the R.I.E. process, thereby resulting in the structure shown in FIG. 1B.

Figure 1C:
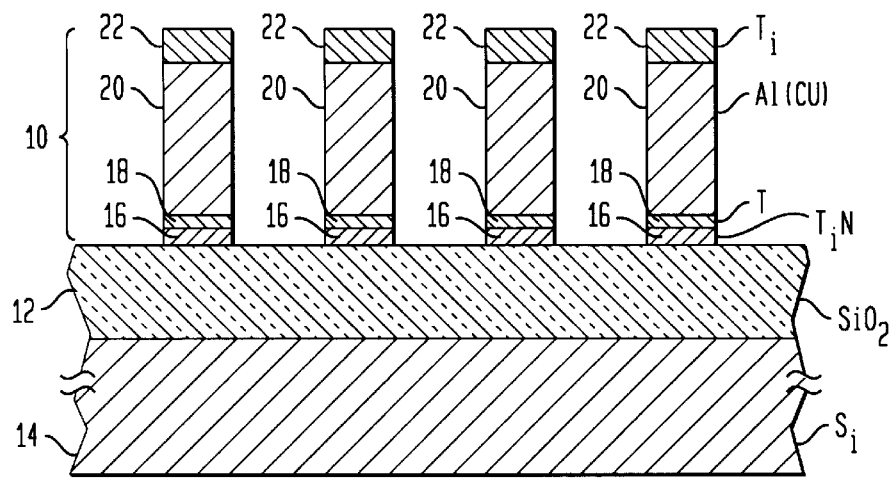

Next, the photoresist layer 26 and ARC 24 are stripped in a LAM DownStream Quartz (DSQ) stripper after which the resulting structure is rinsed in an APM water rinse. The resulting structure is shown in FIG. 1C.

Figure 4A:
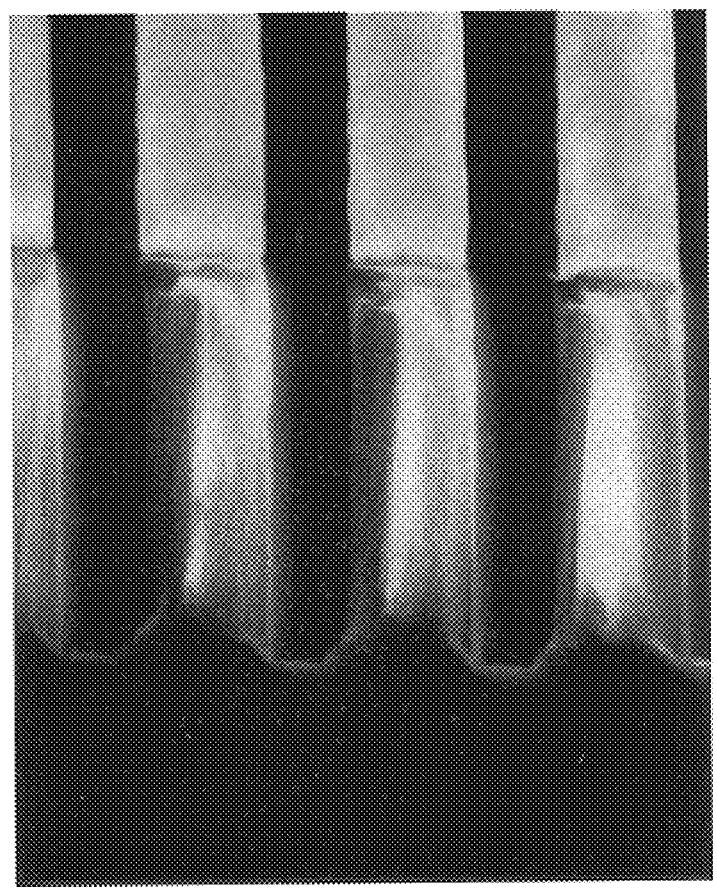
FIGS. 4A and 4B are center and edge scanning electron microscope (SEM) photographs, respectively, of the wafer in FIG. 1A after being processed in accordance with the invention with a silicon tetrachloride flow rate into the chamber of the tool of FIG. 2 of 5 standard cubic centimeters (sccm)
Figure 4B:
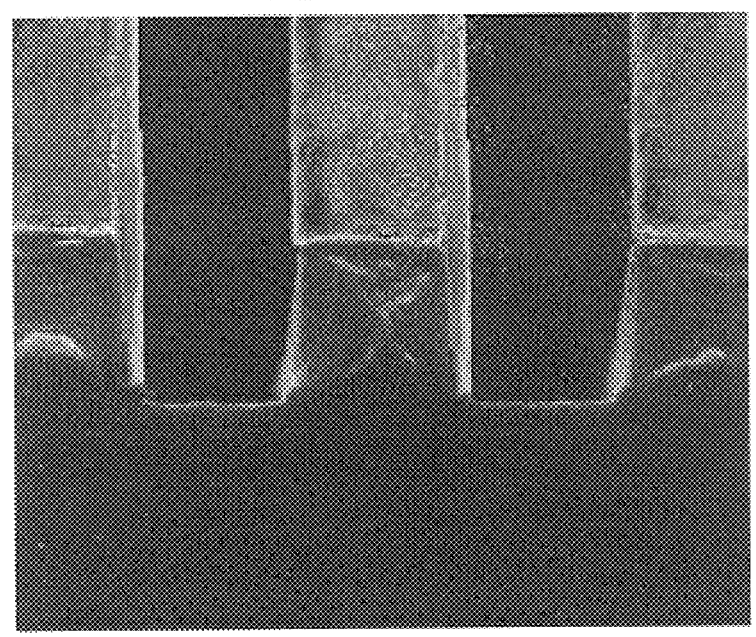

FIGS. 4A and 4B are center and edge scanning electron microscope (SEM) photographs, respectively, of the wafer in FIG. 1A after being processed in accordance with the invention with a silicon tetrachloride flow rate into the chamber of the tool of FIG. 2 of 5 standard cubic centimeters (sccm). No undercutting of the aluminum under the titanium layers 18, 22 is observed.

Figure 5A:
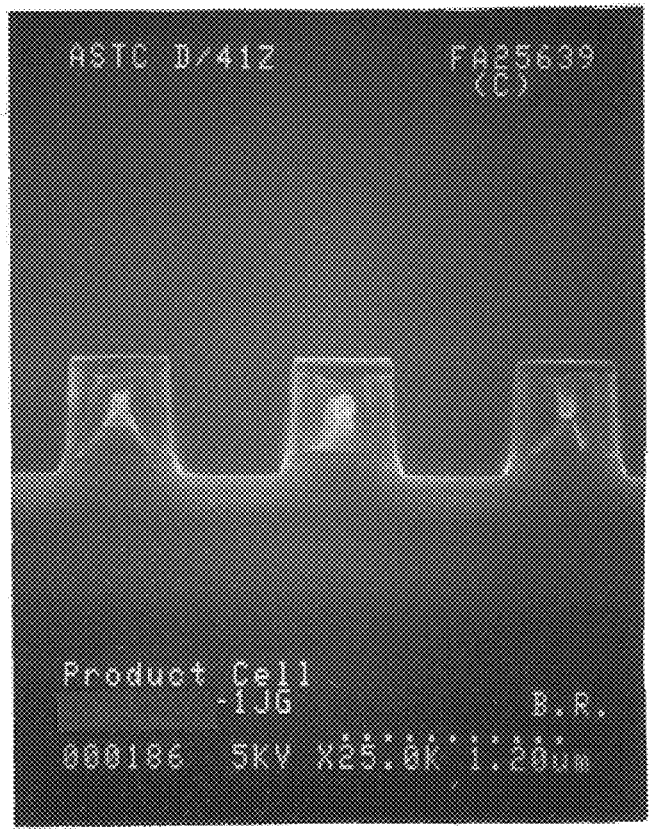
FIGS. 5A and 5B are center and edge scanning electron microscope (SEM) photographs, respectively, of the wafer in FIG. 1A after being processed in accordance with the invention with a silicon tetrachloride flow rate into the chamber of the tool of FIG. 2 of 8 standard cubic centimeters (sccm)
Figure 5B:
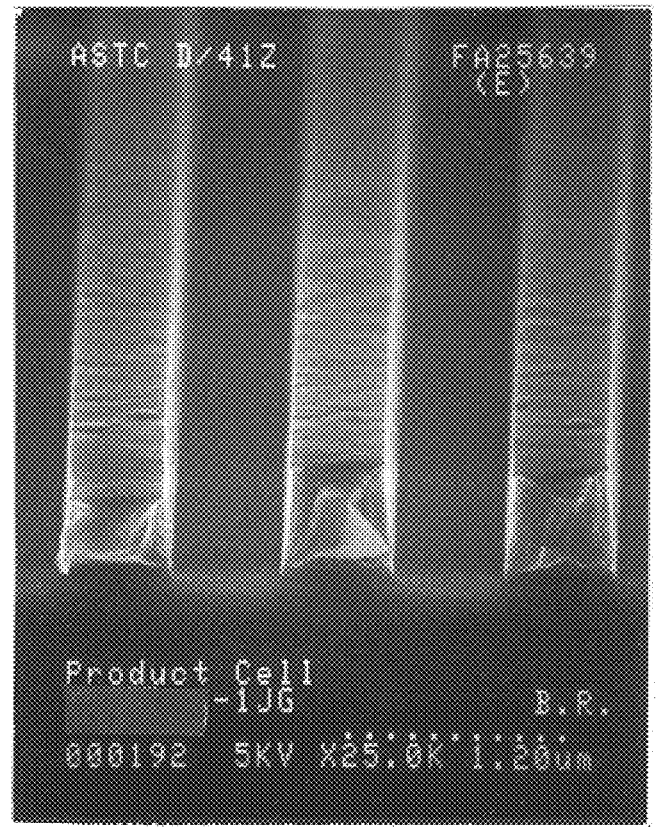

FIGS. 5A and 5B are center and edge scanning electron microscope (SEM) photographs, respectively, of the wafer in FIG. 1A after being processed in accordance with the invention with a silicon tetrachloride flow rate into the chamber of the tool of FIG. 2 of about 8 standard cubic centimeters (sccm). No undercutting of the aluminum under the titanium layers 18, 22 is observed.

Figure 6:
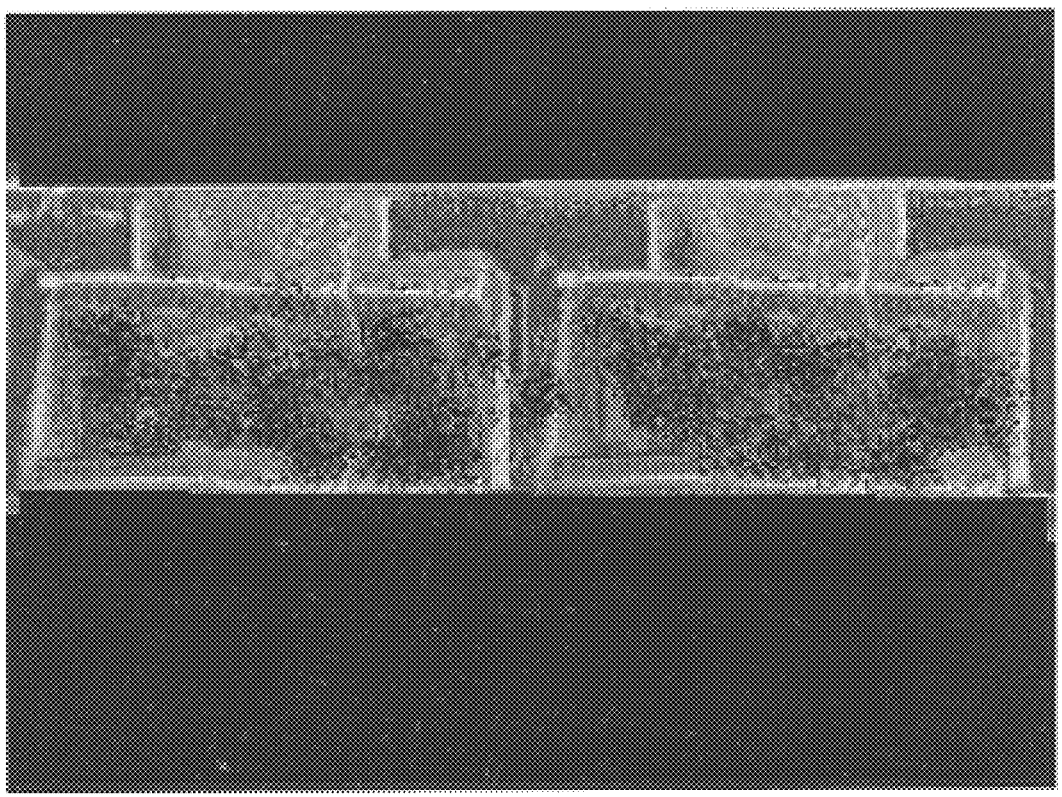
FIG. 6 is an edge scanning electron microscope (SEM) photograph of the wafer in FIG. 1A after being processed with a silicon tetrachloride flow rate into the chamber of the tool of FIG. 2 of 0 standard cubic centimeters (sccm)

FIG. 6 is an edge scanning electron microscope (SEM) photograph of the wafer in FIG. 1A after being processed with a silicon tetrachloride flow rate into the chamber of the tool of FIG. 2 of 0 standard cubic centimeters (sccm). Substantial undercutting of the aluminum under the titanium layers 18, 22 is observed.

Figure 7A:
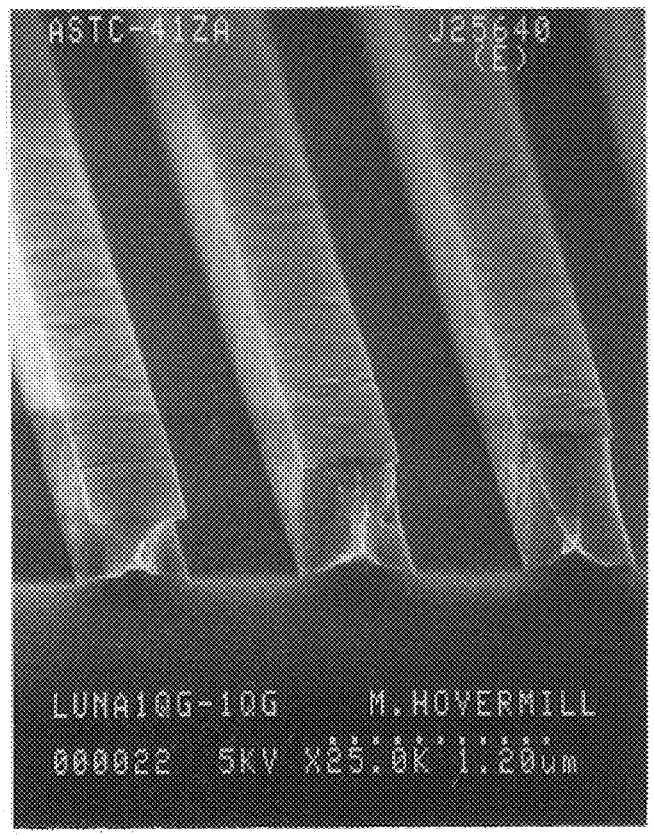
FIGS. 7A and 7B are center and edge scanning electron microscope (SEM) photographs, respectively, of the wafer in FIG. 1A after being processed with a silicon tetrachloride flow rate into the chamber of the tool of FIG. 2 of 3 standard cubic centimeters (sccm)
Figure 7B:
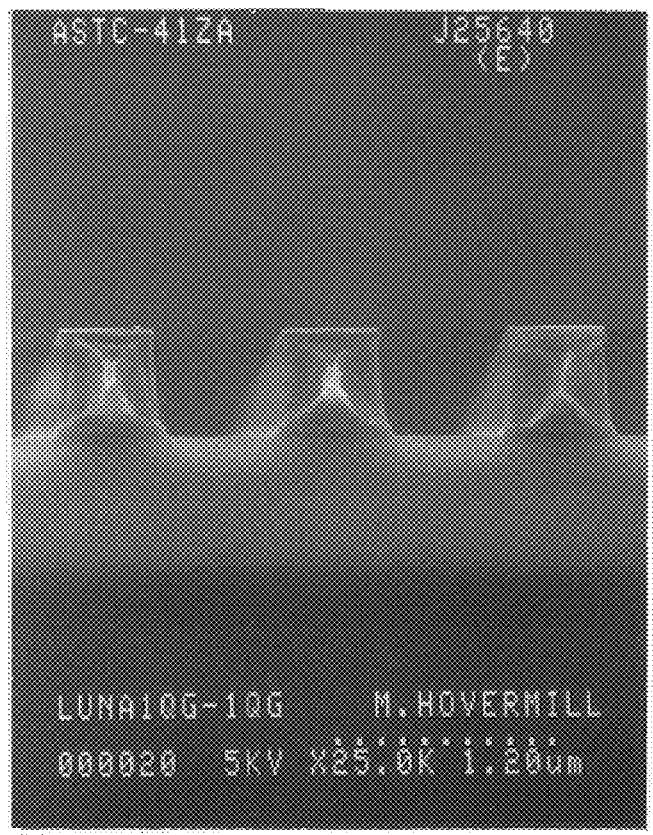

FIGS. 7A and 7B are center and edge scanning electron microscope (SEM) photographs, respectively, of the wafer in FIG. 1A after being processed in accordance with the invention with a silicon tetrachloride flow rate into the chamber of the tool of FIG. 2 of 3 standard cubic centimeters (sccm). Some undercutting of the aluminum under the titanium layers 18, 22 is observed.

Figure 8:
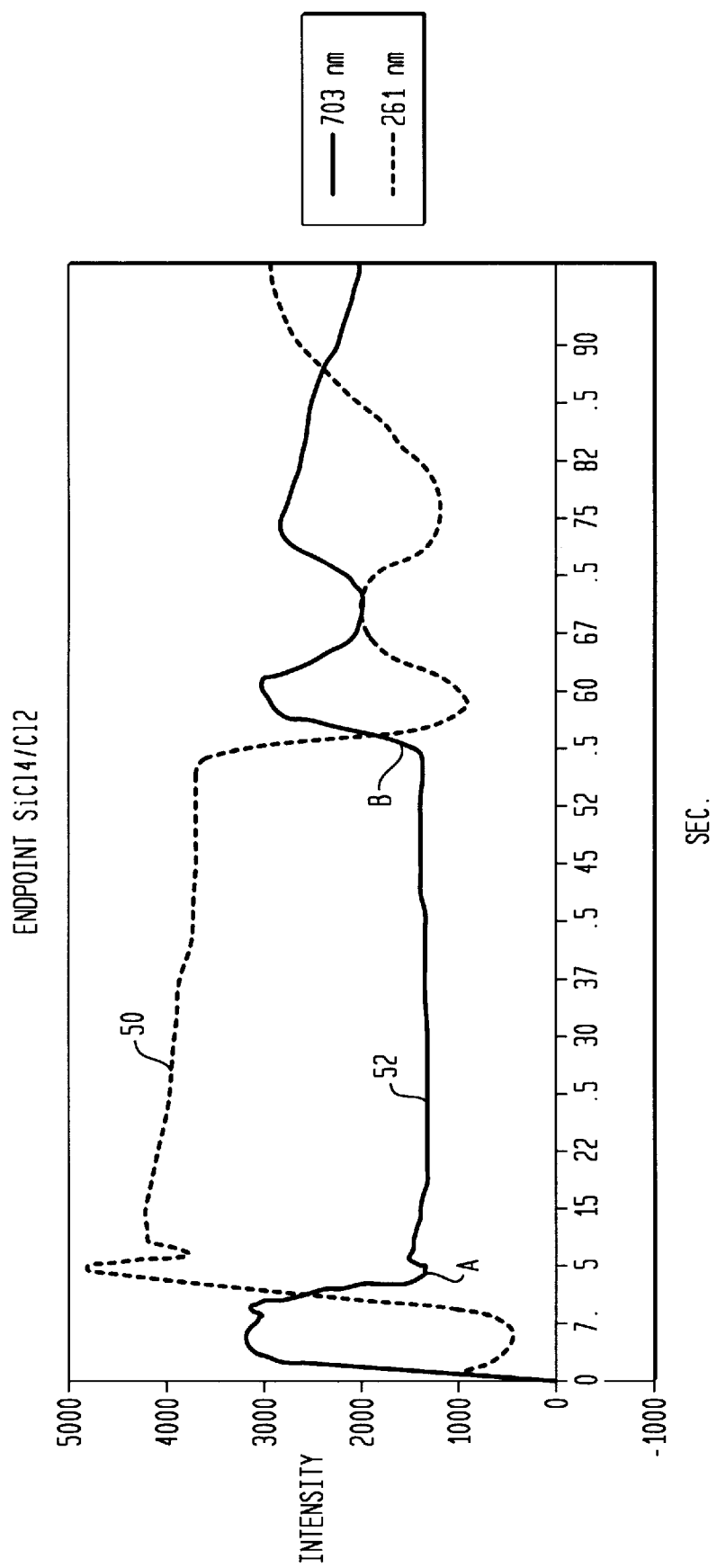
FIG. 8 is a pair of curves of emission spectrometer intensity measurements as a function of time, the curve shown in the solid line representing a wavelength of 703 nm (i.e., AlCl) and the curve in the dotted line representing a wavelength of 261 nm ($Cl_2$).

FIG. 8 is a pair of curves of emission spectrometer intensity measurements as a function of time, the curve shown in the solid line 52 representing a wavelength of 703 nm (i.e., AlCl) and the curve in the dotted line 50 representing a wavelength of 261 nm ($Cl_2$). The aluminum layer 20 is etched between points A and B.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

What is claimed is:

1. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride is introduced into the chamber at a flow rate selected to etch, at an etch rate of about 6000 A/minute, portions of the metalization layer exposed by the photoresist without etching portions of the aluminum layer between the barrier metal layers, wherein the flow rate of the silicon tetrachloride is greater than 4 sccm and less than 15 sccm.

2. The method recited in claim 1 wherein the flow rate is selected to etch aluminum with vertical sidewalls perpendicular to the surface of the semiconductor body to within about three degrees.

3. The method recited in claim 1 wherein chamber is at a pressure in the range of about 5 milliTorr to 20 milliTorr during the etching of the metalization layer.

4. The method recited in claim 3 wherein the chamber operates with an RF power in the range of about 100 watts to 200 watts while the semiconductor is disposed on a platform in the chamber having an RF bias power level in the range of about 100 watts to 300 watts during the etching.

5. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch, at an etch rate of about 6000 A/minute, portions of the metalization layer exposed by the photoresist, without etching portions of the aluminum layer between the barrier metal layers, wherein the flow rate of the silicon tetrachloride is in the range of 4 to 8 sccm.

6. The method recited in claim 5 wherein the flow rates are selected to etch aluminum with vertical sidewalls perpendicular to the surface of the semiconductor body to within about three degrees.

7. The method recited in claim 5 wherein the rate of the chlorine is in the range of 50 sccm to 150 sccm.

8. The method recited in claim 7 wherein chamber is at a pressure in the range of about 5 milliTorr to 20 milliTorr during the etching of the metalization layer.

9. The method recited in claim 8 wherein the chamber operates with an RF power the range of about 100 watts to 200 watts while the semiconductor is disposed on a platform in the chamber having an RF bias power level in the range of about 100 watts to 300 about watts during the etching.

10. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride is introduced into the chamber at a flow rate greater than 4 sccm and less than 15 sccm to etch portions of the metalization layer exposed by the photoresist with aluminum having substantially vertical sidewalls.

11. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride is introduced into the chamber to etch portions of the metalization layer exposed by the photoresist with aluminum having substantially vertical sidewalls, wherein the chamber is at a pressure in a range of about 5 milliTorr to 20 milliTorr during the etching of the metalization layer.

12. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch portions of the metalization layer exposed by the photoresist with aluminum having substantially vertical sidewalls, wherein the flow rate of the silicon tetrachloride is in a range of 4 to 8 sccm.

13. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch portions of the metalization layer exposed by the photoresist with aluminum having substantially vertical sidewalls, wherein the flow rate of the chlorine is in a range of 50 sccm to 150 sccm.

14. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch portions of the metalization layer exposed by the photoresist with aluminum having substantially vertical sidewalls, wherein the chamber is at a pressure in a range of about 5 milliTorr to 20 milliTorr during the etching of the metalization layer.

15. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch portions of the metalization layer exposed by the photoresist with aluminum having substantially vertical sidewalls, wherein the chamber operates with an RF power in a range of about 100 watts to 200 watts while the semiconductor is disposed on a platform in the chamber having an RF bias power level in a range of about 100 watts to 300 watts during the etching.

16. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride is introduced into the chamber at a flow rate selected to etch, at an etch rate of about 6000 A/minute, portions of the metalization layer exposed by the photoresist without etching portions of the aluminum layer between the barrier metal layers.

17. A method for forming integrated circuit conductors, comprising the steps of:

placing in a reactive ion etching chamber a semiconductor body having disposed over a surface thereof: a metalization layer comprising an aluminum layer disposed between a pair of barrier metal layers; and, a photoresist layer disposed on a selected portion of a surface of an upper one of the pair of barrier layers;

inductively coupling radio frequency energy into the chamber while a process gas consisting essentially of silicon tetrachloride and chlorine is introduced into the chamber at a flow rate of silicon tetrachloride and a flow rate of chlorine selected to etch, at an etch rate of about 6000 A/minute, portions of the metalization layer exposed by the photoresist without etching portions of the aluminum layer between the barrier metal layers.

* * * * *